(12) United States Patent
Lake et al.

(10) Patent No.: US 8,445,831 B2
(45) Date of Patent: May 21, 2013

(54) LIQUID ELECTRICAL INTERCONNECT AND DEVICES USING SAME

(75) Inventors: Rick Lake, Meridian, ID (US); Ulrich Boettiger, Garden City, ID (US); Shashikant Hegde, Boise, ID (US); Jacques Duparre, Jena (DE)

(73) Assignee: Aptina Imaging Corporation, George Town (KY)

( * ) Notice: Subject to any disclaimer, the term of this patent is extended or adjusted under 35 U.S.C. 154(b) by 0 days.

(21) Appl. No.: 13/302,907

(22) Filed: Nov. 22, 2011

(65) Prior Publication Data

US 2012/0061787 A1    Mar. 15, 2012

Related U.S. Application Data

(62) Division of application No. 12/429,728, filed on Apr. 24, 2009.

(51) Int. Cl.
*H01L 27/00* (2006.01)
*H01L 23/48* (2006.01)

(52) U.S. Cl.
USPC ......................... 250/208.1; 257/778

(58) Field of Classification Search
USPC ......................... 250/208.1; 257/778
See application file for complete search history.

(56) References Cited

U.S. PATENT DOCUMENTS

| | | | |
|---|---|---|---|
| 4,770,641 A * | 9/1988 | Rowlette | 439/86 |
| 5,170,930 A | 12/1992 | Dolbear et al. | |
| 5,878,485 A | 3/1999 | Wood et al. | |
| 5,920,125 A * | 7/1999 | Ellerson et al. | 257/778 |
| 6,720,500 B1 * | 4/2004 | Inoue | 174/258 |
| 6,828,665 B2 * | 12/2004 | Pu et al. | 257/686 |
| 6,983,536 B2 | 1/2006 | Farnworth et al. | |
| 2001/0013655 A1 | 8/2001 | Smith | |
| 2008/0157361 A1 | 7/2008 | Wood et al. | |
| 2008/0218623 A1 * | 9/2008 | Lo et al. | 348/345 |

* cited by examiner

*Primary Examiner* — Thanh Luu
(74) *Attorney, Agent, or Firm* — Kendall P. Woodruff

(57) ABSTRACT

Various embodiments include interconnects for semiconductor structures that can include a first conductive structure, a second conductive structure and a non-hardening liquid conductive material in contact with the first and second structure. Other embodiments include semiconductor components and imager devices using the interconnects. Further embodiments include methods of forming a semiconductor structure and focusing methods for an imager device.

15 Claims, 7 Drawing Sheets

US 8,445,831 B2

LIQUID ELECTRICAL INTERCONNECT AND DEVICES USING SAME

This application is a division of and claims priority to U.S. patent application Ser. No. 12/429,728, filed on Apr. 24, 2009, which is hereby incorporated by reference herein in its entirety.

FIELD OF THE INVENTION

This invention pertains to liquid interconnect systems, and methods of forming conductive liquid interconnections between electrical nodes.

BACKGROUND OF THE INVENTION

In semiconductor manufacture, packaging is the final operation that transforms a semiconductor substrate into a functional semiconductor component. Typically, the semiconductor substrate is in the form of a semiconductor die. Packaging provides protection for the semiconductor substrate, a signal transmission system for the integrated circuits on the semiconductor substrate, and external connection points for the component. In response to the demand for smaller, lighter and thinner consumer products, new semiconductor components and new packaging methods are being developed.

In fabricating a semiconductor component, it is sometimes necessary to provide interconnects which allow transmission of signals from a circuit side of a semiconductor substrate to the backside of the semiconductor substrate. Interconnects or through wafer interconnects which extend through the semiconductor substrate from the circuit side to the backside are sometimes referred to as through interconnects. Typically, through interconnects comprise metal filled vias formed in the semiconductor substrate, which are configured to electrically connect the integrated circuits on the circuit side to elements on the backside of the semiconductor substrate.

In the manufacture of a semiconductor component, the semiconductor substrate may be mounted and bonded to a second substrate. Typically, when the two substrates are bonded, they are securely bonded and no movement of the substrates relative to one another is permitted. Further, with a fixed electrical connection between the substrates, such as a solder connection, the electrical connection can fatigue degrading the connection between the substrates. Further, a fixed electrical connection can not accommodate large differences in the coefficients of thermal expansion (CTE) between the substrates.

A through interconnect that can overcome one or more of these issues and a method of providing the same are desirable.

DETAILED DESCRIPTION OF THE INVENTION

In the following detailed description, reference is made to the accompanying drawings which form a part hereof, and in which are shown by way of illustration specific embodiments that may be practiced. It should be understood that like reference numbers represent like elements throughout the drawings. These example embodiments are described in sufficient detail to enable those skilled in the art to practice them. It is to be understood that other embodiments may be utilized, and that structural, material, and electrical changes may be made, only some of which are discussed in detail below.

Figure 1:
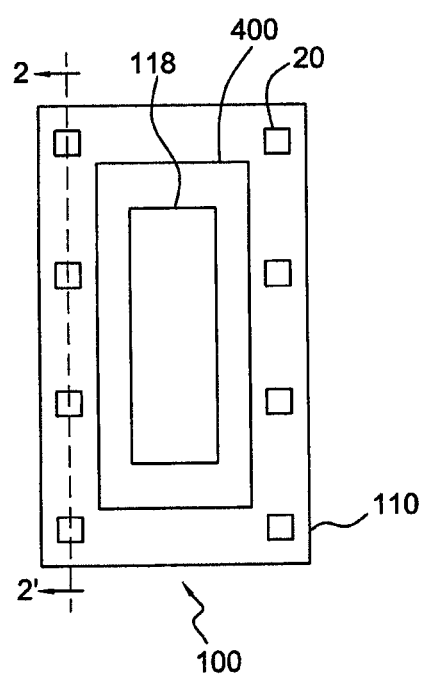
FIG. 1 is a diagram of a semiconductor component in accordance with an embodiment of the invention.
Figure 2A:
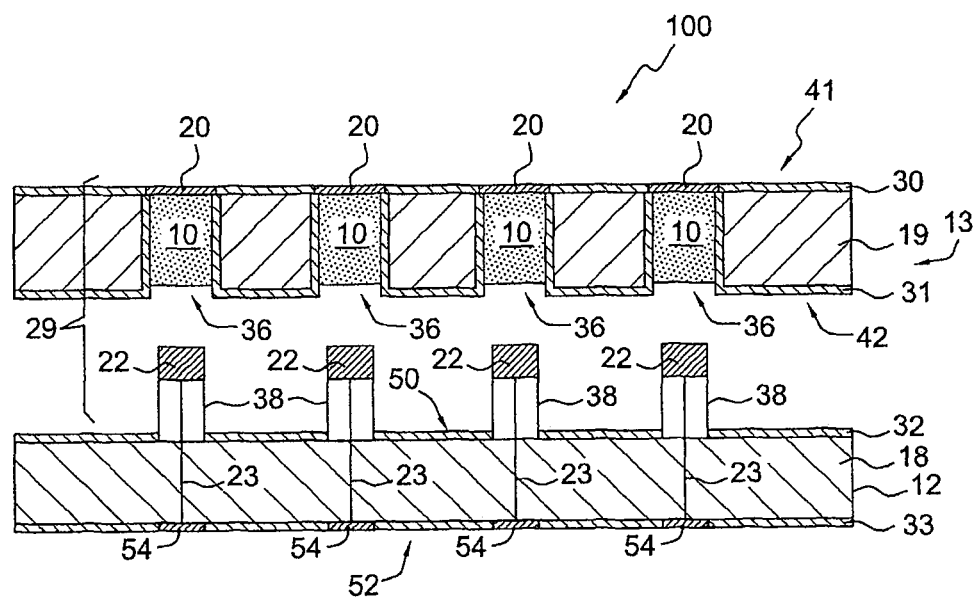
FIG. 2A is a cross sectional view of the semiconductor component of FIG. 1 along the line 2-2' at a stage of processing.
Figure 2B:
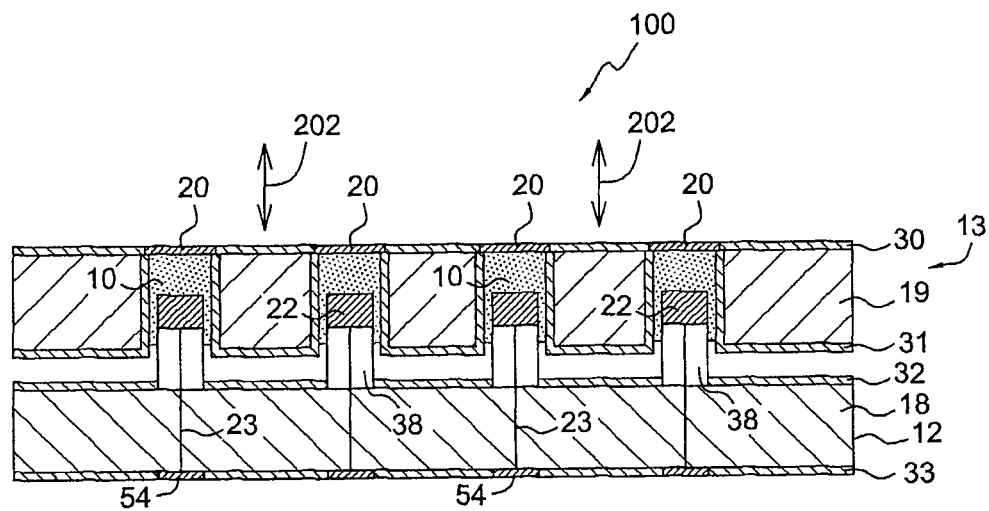
FIG. 2B is a cross sectional view of the semiconductor component of FIG. 1 along the line 2-2' at another stage of processing.

Referring to FIG. 1, a semiconductor structure 100 is illustrated. The semiconductor structure 100 includes a first substrate 13 (FIGS. 2A-2B); and second substrate 12 (FIGS. 2A-2B). The first substrate 13 is, for example, a semiconductor substrate. The second substrate 12 can be, for example, an interposer or mounting substrate or another semiconductor substrate. In the semiconductor structure 100, both the first substrate 13 and the second substrate 12 can comprise silicon, or another semiconductor material such as germanium or gallium arsenide. The second substrate can also comprise a semiconductor material or other suitable materials such as glasses or polymers.

The first substrate 13 includes integrated circuits. In the illustrated example, the first substrate 13 comprises an imager die 110, having an imager device 400, including a pixel array 118.

The first substrate also includes a plurality of substrate contacts 20 in electrical communication with the integrated circuits. The substrate contacts 20 can comprise device bond pads, or alternately redistribution contacts (i.e., contacts formed in conjunction with an electrical redistribution layer (RDL)). In addition, the substrate contacts 20 can comprise a highly-conductive material, such as aluminum or copper. The substrate contacts 20 can also comprise stacks of different materials, such as aluminum-nickel-gold, aluminum-nickel-solder, copper-palladium, and aluminum on copper.

For simplicity, the first substrate 13 is illustrated with only eight substrate contacts 20 arranged in an edge array along the opposite peripheral edges of the first substrate 13. However, in actual practice the first substrate 13 can include more or fewer substrate contacts 20 arranged in a desired configuration, such as a center array, an edge array or an area array. Also, as shown in FIG. 1, the substrate contacts 20 have a generally square peripheral outline. However, the substrate contacts 20 can be formed in a pattern having any shape including square, rectangular, circular, triangular and oval. In addition, a size of the substrate contacts 20 can be selected as required. Further, each substrate contact 20 can comprise a generally planar pad as shown, or can have other shapes such as a projection, a bump or a volcano shape.

Referring to FIGS. 2A-2B, which shows the substrates 13 and 12 separated and then connected as well as the connection between substrates 13 and 12, for one semiconductor structure 100 the first substrate 13 has a circuit side or first side 41, and a back side or second side 42. The substrate contacts 20 can be in electrical communication with internal conductors (not shown) located within the first substrate 13. In addition, the internal conductors can be in electrical communication with the circuitry fabricated on the first substrate 13. Further, the first substrate 13 includes an electrical insulation layer 30 on the circuit side 41. The insulation layer 30 isolates the contacts 20 from one another and can comprise an electrically insulating material, such as BPSG (borophosilicate glass), a polymer (e.g., polyimide, polydimethylsiloxane (PDMS)) or an oxide ($SiO_2$).

For some applications, at least some of the substrate contacts 20 can comprise special purpose contacts. For example, the substrate contacts 20 can comprise electrically isolated contacts that are not in electrical communication with the integrated circuits on the first substrate 13.

As shown in FIGS. 2A-2B, the semiconductor structure 100 also includes a plurality of through interconnects 29, each of which connects with a respective contact 20 on substrate 13 with a contact 22 on substrate 12 placing the contacts 20, 22 in electrical communication with the through interconnects 29. Each through interconnect 29 includes a sidewall insulated substrate opening 36, such as a via, in the first substrate 13 aligned with an associated substrate contact 20.

The openings 36 are partially filled with a liquid conductive material 10. The amount of liquid conductive material 10 should be sufficient to provide an electrical connection between contact 20 and contact 22 (described below), but should not significantly overflow from opening 36 when the first and second substrates 13, 12 are connected (as described in more detail below). In the example illustrated in FIGS. 2A-2B, the liquid conductive material 10 has a viscosity such that it remains within opening 36 independent of the orientation of the second substrate 13.

The liquid conductive material 10 can be any non-solid, non-hardening conductive material, for example, a high viscosity putty, caulk, paste or a low viscosity liquid. In the illustrated example, the liquid conductive material 10 is a non-hardening material, meaning that the liquid conductive material 10 will remain a liquid under the standard processing and operational conditions of the structure 100. The liquid conductive material 10 should be a material that does not evaporate over its lifetime, such as a material with a low vapor pressure, e.g., less than 1 mmHg at 20° C. Other characteristics for the liquid conductive material 10, such as viscosity, melting, freezing and boiling points can be chosen based on the particular application of the structure 100.

Examples of materials suitable for the liquid conductive material 10 include a non-hardening epoxy or similar material that includes a conductive filler, such as nano scale particles, such that the epoxy is conductive in a liquid state.

In one example, the liquid conductive material 10 is an uncured epoxy that is substantially conductive in the low-viscosity, uncured form. In one example, the conductive epoxy has sufficient conductivity that a 15 mil length sample of the liquid conductive epoxy having cross-sectional dimensions of 50 mil by 2 mil would have a resistance of less than about 1000 ohms along its length while having a viscosity of less than about 1,000,000 cps.

A suitable epoxy is a silver-containing epoxy sold under the product name 116-37A by Creative Materials, Inc. of Tyngsboro, Mass. If desired, the silver containing epoxy can be mixed with one or more other liquids. In one example the silver-containing epoxy is mixed with a second liquid, which comprises an ionic salt. Preferably, the ionic salt is soluble in at least one of the first and second liquids. The ionic salt can comprise organic salts and/or inorganic salts. The ionic salt can comprise, for example, a lithium salt, such as a lithium imide salt. Suitable lithium salts are, for example, $LiAsF_6$ and $LiN(CF_3SO_2)_2$.

The mixing of the second liquid with the epoxy can occur prior to, or after, placement of the epoxy into opening 36. In one example, the final concentration of ionic salt within the epoxy mixture is from about 0.4% (by weight) to about 2% (by weight).

Suitable liquids for mixing with the silver-containing epoxy include a thinner, which lowers the viscosity of the epoxy. The thinner can be, for example, aliphatic glycidyl ethers and aromatic glycidyl ethers, such as Heloxy 61 and Heloxy 7 by Shell Chemical Company of Houston, Tex.

The liquid conductive material 10 can also be an electrolyte. For example, polypropylene glycol mixed with lithium based salts, such as those used in lithium and lithium ion batteries. Other examples of electrolyte materials suitable for the liquid conductive material 10 include polymer electrolytes that use polyethylene oxide (PEO) with salts. The melting point of PEO is 38° C., which can be lowered by the salts or other additives. Further, the viscosity of PEO can be modified by including propylene glycol, if desired.

In another example, an electrolyte can be used in the epoxy described above to provide conductivity in place of the silver or to enhance conductivity in conjunction with the silver.

Each through interconnect 29 also includes a projection 38 on a front side 50 of the second substrate 12 supporting a contact 22. The projection 38 and associated contact 22 is in mating physical engagement with an associated substrate opening 36. The projections 38 can be vertical pins, such as wirebonded stud bumps, or any other projection. The substrate openings 36 in the first substrate 13 for the through interconnects 29, and the projections 38 on the second substrate 12 for the through interconnects 29, can be formed with mating sizes and shapes using anisotropic etching processes.

Each projection 38 includes a contact 22 configured for physical and electrical contact with the liquid conductive material 10, which, in turn is in contact with an associated substrate 13 contact 20. The contacts 22 can comprise pads or bumps formed on the top surfaces of the projections 38, or alternately can comprise the upper planar surfaces of the conductive connection 23 (described below). In addition, the contacts 22 can comprise metal, solder, or a conductive polymer that provides an electrical connection with the liquid interconnect material 10.

As shown in FIGS. 2A-2B, there are conductive connections 23 from contact 22 of projection 38 to additional circuitry 54 provided on the second substrate 12. Each projection 38 can have one or more conductive connections 23. The conductive connection 23 can comprise an electrically conductive metal, or a conductive polymer, deposited in an electrically insulated via of a selected diameter, or any other conductive structures or interconnects.

The first substrate 13 can also include an electrical insulation layer 31 on the back side 42 thereof extending into the substrate openings 36 of the through interconnects 29, but not to cover access to contacts 20. The electrical insulation layer 31 can comprise a single layer of material or the substrate openings 36 can include one or more different insulation layers from that provided on the second side 42 of the substrate 13. In addition, the second substrate 12 includes an electrical insulation layer 32 on a front side 50 thereof, which do not cover contacts 22 or 54, and an electrical insulation layer 33 on a backside 52 thereof. As with the insulation layer 30, the electrical insulation layers 31, 32 and 33 can comprise an electrically insulating material, such as a glass (e.g., borophosphosilicate glass), a polymer (e.g., polyimide, polydimethylsiloxane (PDMS)), or an oxide (e.g., $SiO_2$) and can serve to isolate electrical circuitry 54. For some applications, one or more of the electrical insulation layers 30, 31, 32 and 33 can be omitted.

While use of the liquid conductive material 10 as an interconnect is described in connection with a through interconnect 29, the liquid conductive material 10 can be used with other interconnects and to provide other electrical connections between structures or devices. Use of the liquid conductive material 10 is particularly suitable to accommodate large differences in the coefficients of thermal expansion (CTE) between structures connected by the liquid conductive material 10 or where it is desirable to maintain movement between the structures connected by the liquid conductive material 10, e.g., between substrates 13 and 12, such as to buffer one or the other of the structures from vibration or to enable adjustments in the alignment between the structures.

Figure 5A:
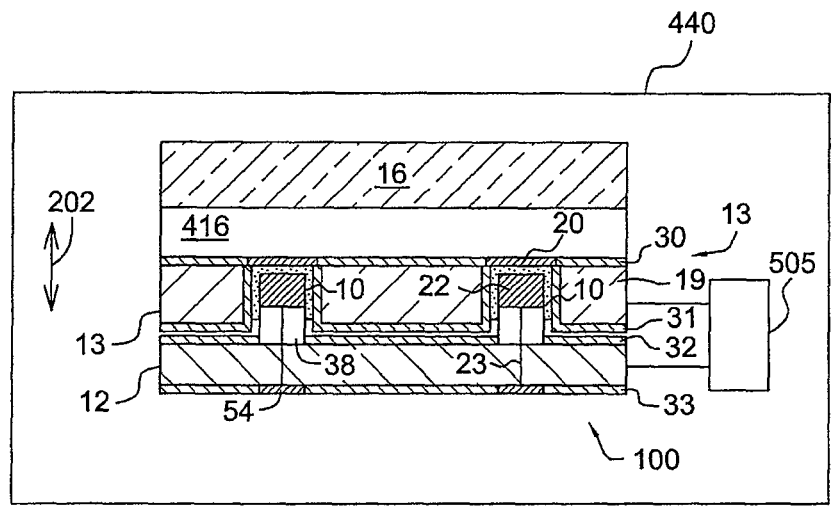
FIGS. 5A-5C depict imager devices including the semiconductor component of FIG. 1.
Figure 5B:
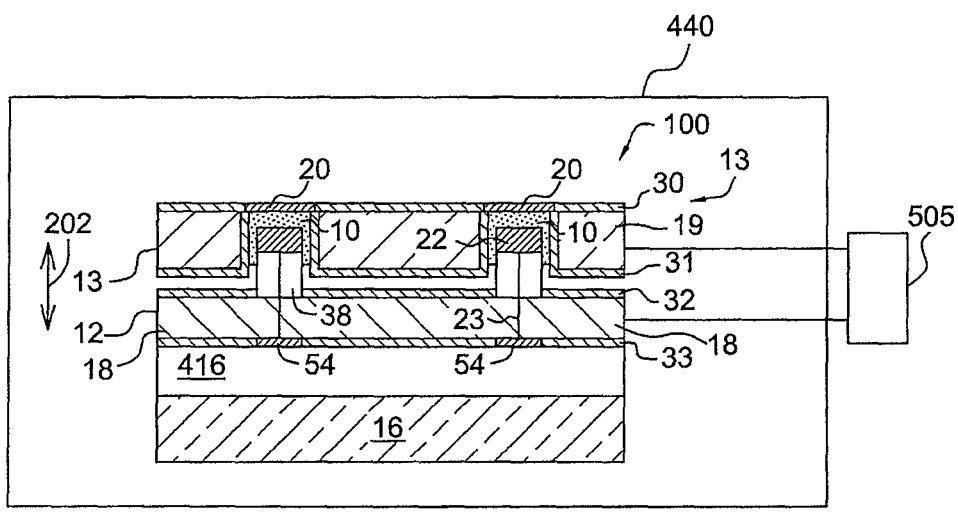
Figure 5C:
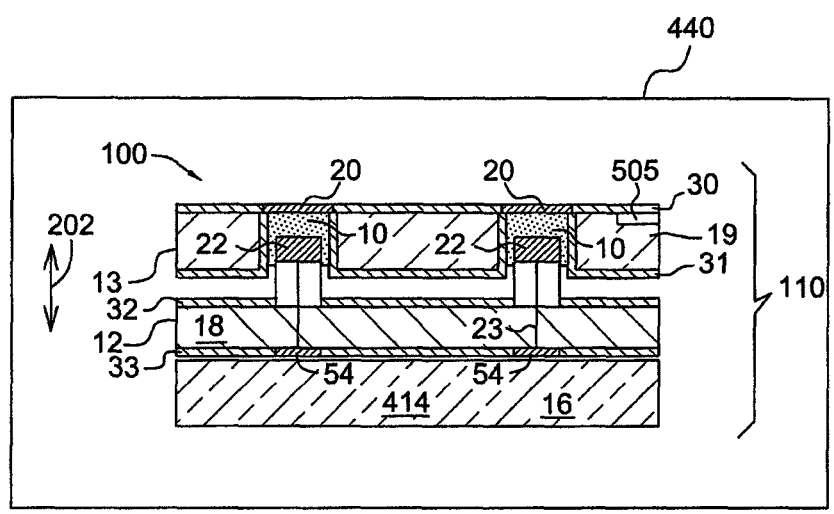

If desired, additional substrates, such as a third substrate 414 (FIG. 5C) can be included. Such multi-substrate semiconductor structures 100 can be used in the fabrication of imager modules in which case the third substrate 414 can be transparent or partially transparent substrate and include one or more lenses 16 (FIG. 5C). A transparent substrate can comprise glass, silicon or a composite material (silicon on glass). In addition, for uses in imager modules, the first substrate 13 can comprise a full thickness semiconductor substrate or a thinned semiconductor substrate.

If the semiconductor structure 100 is used for an imager apparatus 440 (FIGS. 5A-5C), the first substrate 13 (FIGS. 2A-2B) can comprises an imager die 110 (FIG. 1), having an imager device 400, including a pixel array 118. The second substrate 12 can comprise a passive element having no active semiconductor devices. In an alternate example, the second substrate 12 can include active semiconductor devices. The semiconductor structure 100 may also be designed for other applications besides an imager apparatus. Thus, the first substrate 13 can comprise another type of semiconductor die having integrated circuits constructed in a desired electrical configuration using active semiconductor devices. For example, the first substrate 13 can comprise a high speed digital logic device, such as a dynamic random access memory (DRAM), a static random access memory (SRAM), a flash memory, a microprocessor, a digital signal processor (DSP), an application specific integrated circuit (ASIC), a MEMS type device (e.g., accelerometer, microphone, speaker, electro mechanical device), a solar cell or any other electrical component or system.

Figure 3:
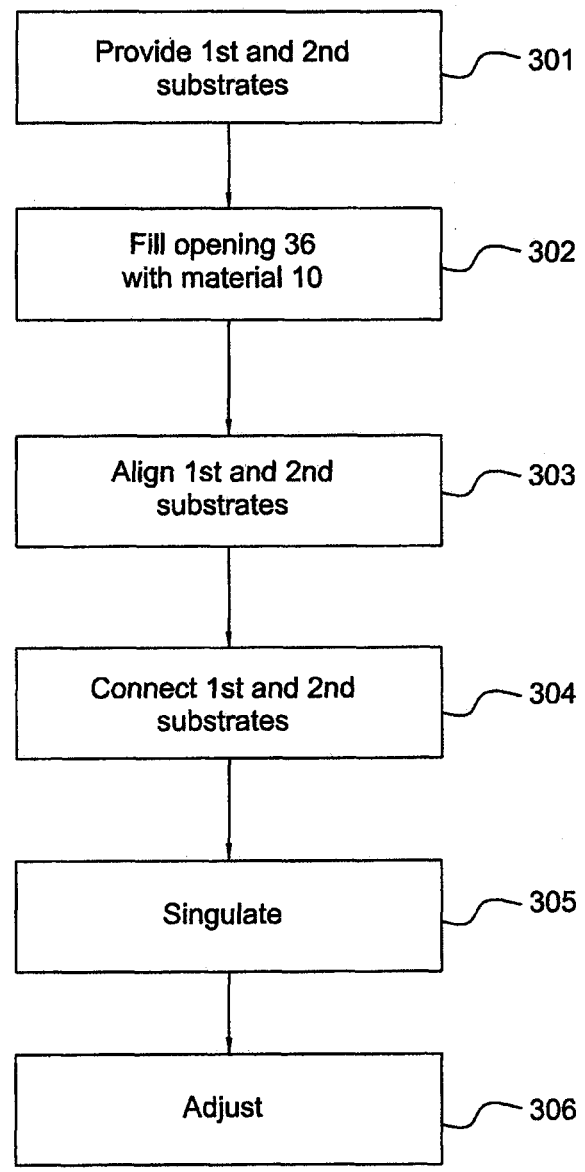
FIG. 3 is a flowchart showing a method of fabricating the semiconductor component of FIG. 1.

Referring to FIG. 3, a method of forming a semiconductor structure 100 is described. While the steps 301-306 shown in FIG. 3 are shown in an exemplary order, it should be understood that the order of the steps 301-306 can be changed and additional steps not described can be conducted before, during and after the steps 301-306 shown in FIG. 3.

In step 301, the first and second substrates 13, 12 are fabricated and provided for assembly. The first and second substrates 13, 12 and the devices and electrical structures thereon, can be formed by known methods. As shown in step 302, the openings 36 formed in substrate 13 are partially filled with the liquid conductive material 10. If an additional substrate is to be included in semiconductor structure 100, such a substrate would also be fabricated and provided in step 301.

Following fabrication of the first substrate 13 and second substrate 12, an aligning step 303 is performed. As shown in FIG. 2A, during the aligning step 303 the first and second substrates 13, 12 are aligned, such that the projections 38 on the second substrate 12 are aligned with the liquid conductive material 10 filled openings 36 on the first substrate 13.

In connection step 304 (FIG. 2B), the first and second substrates 13, 12 are moved together such that the contacts 22 on the projections 38 are placed in physical contact with the liquid conductive material 10.

If an additional substrate is to be included in semiconductor structure 100, such a substrate could be aligned and connected according to known methods either before or after the aligning and connecting steps 303, 304.

Figure 4:
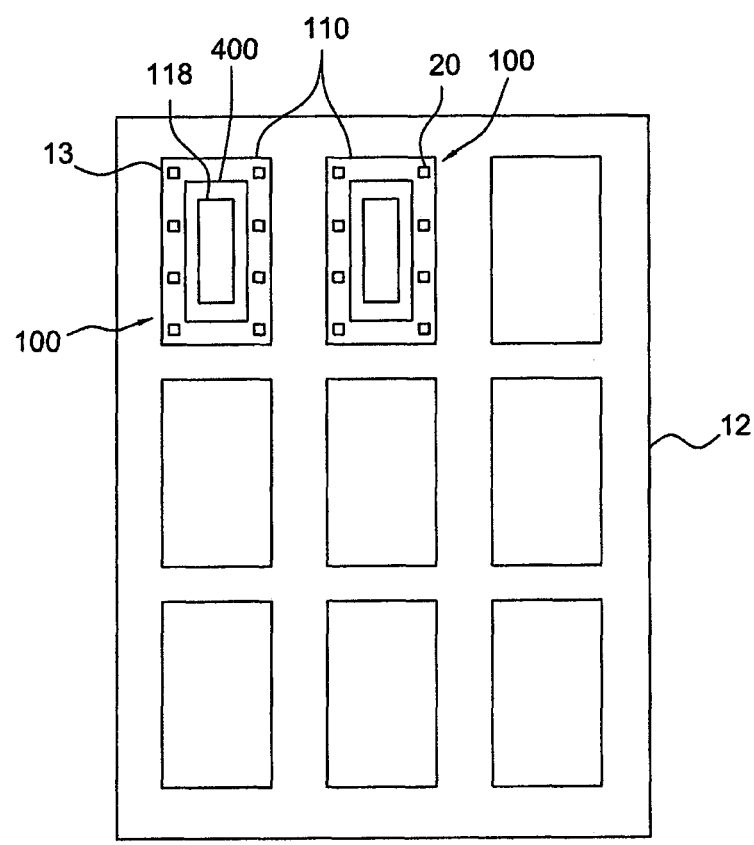
FIG. 4 depicts a plurality of semiconductor components at a stage of processing.

If desired, a plurality of first substrates 13 can be aligned with a common second substrate 12 and the second substrate 12 is cut around the first substrates 13 in a singulation step 305. The singulating step 305 can be performed using a dicing saw or other singulation method, such as cutting with a laser or a water jet, or by etching with a suitable wet or dry etchant. FIG. 4 depicts in top view a plurality of semiconductor components 100 in which a plurality of first substrates 13 are connected with a common second substrate 12, prior to a singulation step 305. As shown in FIG. 4, the semiconductor structure 100 when singulated around substrate 13 can have a generally rectangular chip scale outline. Alternately, the semiconductor structure 100 and the first substrate 13 can have any shape, such as square or triangular, and can also have a circular or oval shape.

Although FIG. 4 shows a plurality of separate first substrates 13 connected to a common substrate 12, it should be understood that the plurality of first substrates 13 can also be part of a common substrate that is connected with second substrate 12. Substrates 13 and 12 can be formed on respective semiconductor wafers. In this case, semiconductor structures 100 are formed by singulation through both substrates 13, 12.

Optionally, an adjusting step 306 can be performed to move one or both of the first and second substrates 13, 12 with respect to one another or with respect to another structure, such as lens structure 16 (described below). As the first and second substrates 13, 12 are not fixedly bonded and are connected by the liquid conductive material 10, the first and second substrates are moveable to some extent with respect to one another as depicted by arrows 202 in FIG. 2B before and after the singulation step 305. According, the adjusting step 306 can be conducted at any time, including during operation of an electronic device or system including the semiconductor structure 100, e.g., an imager device 400 (FIGS. 5A-5C). Movement of the first and second substrates 13, 12 can be accomplished by a device 505 as described below in connection with FIGS. 5A-5C.

In one example, where the semiconductor structure 100 includes an imager device 400 having a pixel array 118 on substrate 13, this movement can be used to focus an image on a pixel of the imager device 400 by enabling movement of the first and/or second substrates 13, 12 toward and away from one another. Thus, the adjusting step 306 can also be a focusing step. Such movement can also accommodate extreme differences in the coefficients of thermal expansion (CTE) between the first and second substrates 13, 12. Further, the liquid conductive material 10 allows one substrate 13, 12 to float with respect to the other substrate 13, 12, buffering it from vibration.

FIGS. 5A-5C depict imager apparatuses 440 constructed using the semiconductor structure 100 where an imager device 400 (FIG. 1) is formed on substrate 13. In the FIG. 5A example, a lens structure 16, which may include one or more lenses for focusing an image on pixel array 118, is located adjacent the first substrate 13. A spacer 416 may be provided between lens structure 16 and substrate 13. Alternatively, the lens structure 16 could be located adjacent the second substrate 12, as shown in FIG. 5B for backside imaging of the pixel array 118. A spacer 416 may be provided lens structure 16 and substrate 12. As another alternative shown in FIG. 5C, the semiconductor structure 100 can also include a third substrate 414 having lens structure 16, which is directly coupled to substrate 12.

During the adjusting step 306 (FIG. 3), one of the first and second substrates 13, 12 is moved with respect to the other and with respect to lens structure 16 as shown by arrows 202. If desired, one substrate 13, 12 can be maintained in a fixed alignment with lens structure 16, e.g., by spacer 416. In such a case, only one substrate 13, 12 is moved, for example, the substrate 13, 12 that is not in a fixed alignment with lens structure 16. Moving one or more of the first and second substrates 13, 12 can require less power than moving the more massive lens structure 16.

The movement can be made by a device 505 that is located internally (FIG. 5A) or externally (FIG. 5B) to the apparatus 440. As another alternative shown in FIG. 5C, the device 505 can be located on the first or second substrates 13, 12. In the FIG. 5C example, the device 505 is located on the first substrate 13, which includes the imager device 400 (FIG. 1). The device 505 can also be included on the second substrate 12. Where the device 505 is located on the first or second substrate 13, 12, the device 505 can be a micro-electromechanical system (MEMS) device.

Figure 6:
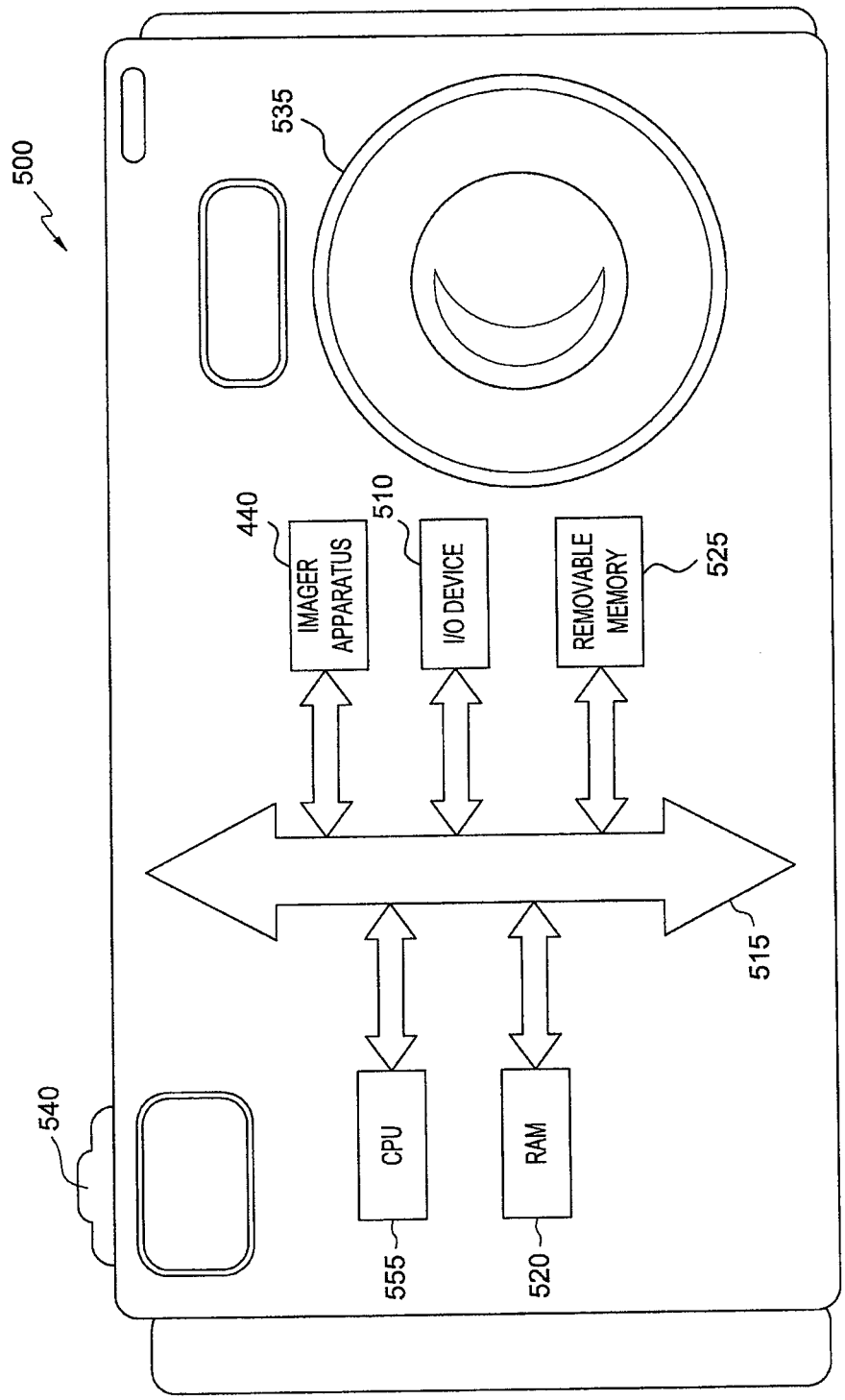
FIG. 6 is a block diagram of a processor system including any one of the imager devices of FIGS. 5A-5C.

FIG. 6 illustrates a processor system as part of a digital still or video camera system 500 employing an imager apparatus 440 as illustrated in any of FIGS. 5A-5C, which include a semiconductor structure 100. The processing system includes a processor 555 (shown as a CPU) which implements system, e.g. camera 500, functions. The processor 555 is coupled with other elements of the system, including random access memory 520, removable memory 525 such as a flash or disc memory, one or more input/output devices 510 for entering data or displaying data and/or images and imager device 400 through bus 515 which may be one or more busses or bridges linking the processor system components. A camera lens 535 allows an image or images of an object being viewed to pass to the pixel array 118 (FIG. 1) of imager apparatus 440 when a "shutter release"/"record" button 540 is depressed.

The camera system 500 is only one example of a processing system having digital circuits that could include image sensor devices. Without being limiting, such a system could also include a computer system, cell phone system, scanner, machine vision system, vehicle navigation system, video phone, surveillance system, auto focus system, star tracker system, motion detection system, image stabilization system, and other image processing systems.

While disclosed embodiments have been described in detail, it should be readily understood that the invention is not limited to the disclosed embodiments. Rather the disclosed embodiments can be modified to incorporate any number of variations, alterations, substitutions or equivalent arrangements not heretofore described.

What is claimed is:

1. A semiconductor structure comprising:
a first substrate comprising:
at least one opening, and
a first conductive contact within the at least one opening;
a second substrate comprising:
at least one projection, and
at least one second conductive contact integrated with the at least one projection;
wherein the at least one opening is in mating physical alignment with the at least one projection; and
a liquid conductive material within the at least one opening, the liquid conductive material remaining a liquid during operation of the semiconductor structure and providing an electrical connection between the first conductive contact and the at least one second conductive contact.

2. The semiconductor structure of claim 1, wherein at least one of the first substrate and the second substrate comprises active semiconductor devices.

3. The semiconductor structure of claim 2, wherein the active semiconductor devices comprise an imager device comprising a pixel array.

4. The semiconductor structure of claim 3, further comprising a third substrate, the third substrate being at least partially transparent and comprising at least one lens for focusing an image on the pixel array.

5. The semiconductor structure of claim 1, wherein the first conductive contact and the at least one second conductive contact form a through interconnect.

6. The semiconductor structure of claim 1, wherein the at least one projection is a vertical pin.

7. The semiconductor structure of claim 1, wherein the first substrate and the second substrate are part of an electronic device and wherein the first substrate and the second substrate are moveable with respect to one another during operation of the device.

8. The semiconductor structure of claim 1, further comprising a device for moving at least one of the first substrate and the second substrate.

9. The semiconductor structure of claim 8, wherein the device comprises a MEMS device.

10. A semiconductor structure comprising:
a first substrate comprising:
at least one opening, and
a first conductive contact within the at least one opening;
a second substrate comprising:
at least one projection, and
at least one second conductive contact integrated with the at least one projection;
wherein the at least one opening is in mating physical alignment with the at least one projection;
a third substrate, the third substrate being at least partially transparent and comprising at least one lens for focusing an image on the pixel array; and
a liquid conductive material within the at least one opening, the liquid conductive material remaining a liquid during operation of the semiconductor structure and providing an electrical connection between the first conductive contact and the at least one second conductive contact, wherein at least one of the first substrate and the second substrate comprises active semiconductor devices, wherein the active semiconductor devices comprise an imager device comprising a pixel array, and wherein at least one of the first substrate and the second substrate is moveable with respect to the third substrate during operation of the device.

11. A semiconductor structure, comprising:
a first substrate, comprising:
a plurality of openings;
a liquid conductive material within each opening in the plurality of openings, wherein the liquid conductive material remains a liquid during operation; and
a plurality of contacts formed on a surface of the first substrate, wherein each contact in the plurality of contacts is aligned with a respective opening in the plurality of openings;
a second substrate, comprising:
first and second opposing surfaces;

a plurality of projections formed on the first surface, wherein each projection in the plurality of projections is configured to mate with a respective opening in the plurality of openings; and electrical circuitry formed on the second surface, wherein a conductive connection is formed between the electrical circuitry of the second substrate and the plurality of contacts of the first substrate via the plurality of projections and the liquid conductive material.

12. The semiconductor structure of claim 11, wherein the first and second substrates are part of an electronic device and wherein the first and second substrates are moveable with respect to one another during operation of the electronic device.

13. The semiconductor structure of claim 11, wherein the first substrate comprises a pixel array.

14. The semiconductor structure of claim 13, further comprising:

a transparent lens structure configured to focus light on the pixel array of the first substrate, wherein the second substrate is interposed between the first substrate and the transparent lens structure, and wherein the first substrate is movable with respect to the lens structure.

15. The semiconductor structure of claim 11, wherein the second substrate comprises active semiconductor devices.

\* \* \* \* \*